US010030916B2

(12) United States Patent
Thanh et al.

(10) Patent No.: US 10,030,916 B2
(45) Date of Patent: Jul. 24, 2018

(54) FLUID FLOW CHANNEL FOR ENHANCED HEAT TRANSFER EFFICIENCY

(71) Applicant: INTEL CORPORATION, Santa Clara, CA (US)

(72) Inventors: Phi Hung Thanh, Aloha, OR (US);
Paul J. Diglio, Chandler, AZ (US);
John C. Johnson, Phoenix, AZ (US);
Jarett L. Rinaldi, Phoenix, AZ (US);
Arnab Choudhury, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 343 days.

(21) Appl. No.: 14/446,123

(22) Filed: Jul. 29, 2014

(65) Prior Publication Data
US 2016/0033208 A1    Feb. 4, 2016

(51) Int. Cl.
| F28F 7/00 | (2006.01) |
| F28F 1/10 | (2006.01) |
| F28F 3/12 | (2006.01) |
| F28F 13/06 | (2006.01) |
| H01L 23/473 | (2006.01) |

(52) U.S. Cl.
CPC ............ *F28F 1/10* (2013.01); *F28F 3/12* (2013.01); *F28F 13/06* (2013.01); *H01L 23/473* (2013.01)

(58) Field of Classification Search
CPC ...... F28F 1/10; F28F 3/08; F28F 3/083; F28F 3/02
USPC ...................... 165/185, 80.2, 80.4
See application file for complete search history.

(56) References Cited

U.S. PATENT DOCUMENTS

| 6,809,625 B2 | 10/2004 | Rinaldi et al. |
| 7,017,654 B2 | 3/2006 | Kenny et al. |
| 8,966,758 B1* | 3/2015 | McReynolds ........... F28F 3/083 165/80.2 |

(Continued)

FOREIGN PATENT DOCUMENTS

| CN | 201297527 | 8/2009 |
| CN | 201680327 U | 12/2010 |

(Continued)

OTHER PUBLICATIONS

Japanese Office Action dated Jul. 26, 2016, English translation included, 8 pages.

(Continued)

*Primary Examiner* — Davis Hwu
(74) *Attorney, Agent, or Firm* — Schwabe, Williamson & Wyatt, P.C.

(57) ABSTRACT

A heat transfer apparatus is described having a manifold. The manifold has a surface having a fluidic exit opening and a fluidic entrance opening. A fluid is to flow from the fluidic exit opening and into the fluidic entrance opening. The manifold has a protrusion emanating from the surface between the fluidic exit opening and the fluidic entrance opening. An apparatus is described having a thermally conductive grooved structure. The thermally conductive grooved structure has a surface having first and second cavities to form first and second fluidic channels. The thermally conductive grooved structure has a protrusion emanating from between the cavities. The protrusion has side surfaces to form parts of the first and second fluidic channels.

12 Claims, 5 Drawing Sheets

(56) References Cited

U.S. PATENT DOCUMENTS

| | | | |
|---|---|---|---|
| 2002/0144809 A1* | 10/2002 | Siu | B21D 53/04 |
| | | | 165/185 |
| 2010/0012303 A1 | 1/2010 | Domen | |
| 2011/0053032 A1 | 3/2011 | Gil et al. | |
| 2013/0180699 A1* | 7/2013 | Dahlberg | F28D 9/0031 |
| | | | 165/185 |
| 2014/0055156 A1 | 2/2014 | Johnson et al. | |
| 2014/0062513 A1 | 3/2014 | Johnson et al. | |
| 2014/0084953 A1 | 3/2014 | Diglio et al. | |

FOREIGN PATENT DOCUMENTS

| | | |
|---|---|---|
| CN | 203051577 U | 7/2013 |
| JP | 5959451 | 4/1984 |
| JP | 2000252670 A | 9/2000 |
| JP | 2005079065 A | 3/2005 |
| JP | 2008-21721 A | 1/2008 |
| JP | 2012109495 A | 6/2012 |
| JP | 2014-060340 A | 4/2014 |

OTHER PUBLICATIONS

Related Japanese Office Action, dated Jan. 24, 2017, Englist translation included, 7 pages.
Office Action for Chinese Patent Application No. 201510415749.7 dated Jan. 17, 2018, 8 pages.

\* cited by examiner

FLUID FLOW CHANNEL FOR ENHANCED HEAT TRANSFER EFFICIENCY

FIELD OF INVENTION

The field of invention relates generally to temperature control systems, and more specifically, to a fluid flow channel for enhanced heat transfer efficiency.

BACKGROUND

FIG. 1 shows a prior art fluidic thermal control assembly. As observed in FIG. 1 the assembly includes a heat generating element 101 (e.g., an operating semiconductor device) that generates heat. The heat generating element 101 is thermo-mechanically coupled to a grooved structure 107 having channels 103 formed therein. The grooved structure is thermally conductive to promote the transfer of heat from the heat generating element to the channels 103. A pump 104 pumps fluid 105 through a manifold 102 and into channels 103. The pumped fluid 105 captures heat generated by the element 101 as it passes through the channels 103 and then flows back into manifold 102.

The heated fluid is then pumped from the manifold 102 to a heat exchanger 106 that extracts the heat from the fluid 105. The cooled fluid is then pumped back into the manifold 102 to remove more heat from the heat generating element.

FIG. 2 shows a more detailed view of the channels 103 formed by the grooved structure 107 and the manifold 102 of FIG. 1. As observed in FIG. 2 multiple fluid flows enter a single channel through manifold exit openings 210 and are drawn out of the channel through manifold entrance openings 211.

BRIEF DESCRIPTION OF THE DRAWINGS

The present invention is illustrated by way of example and not limitation in the figures of the accompanying drawings, in which like references indicate similar elements and in which.

DETAILED DESCRIPTION

It is pertinent to recognize that the cooling/heat transfer efficiency of the overall assembly improves with higher surface velocity of the fluid passing over a larger surface area of the grooved structure. The faster the fluid volume is able to pass over more of the surface area of the heated grooved structure, the more efficient the system becomes. Here, higher speed fluid is able to remove more heat per unit of time than slower moving fluid across a same surface area. Additionally, fluid coverage over a larger surface area of the grooved structure corresponds to greater overall heat removal from the grooved structure. Also, utilizing higher heat transfer with less fluid permits the use of smaller and/or cheaper pumps.

Figure 1:
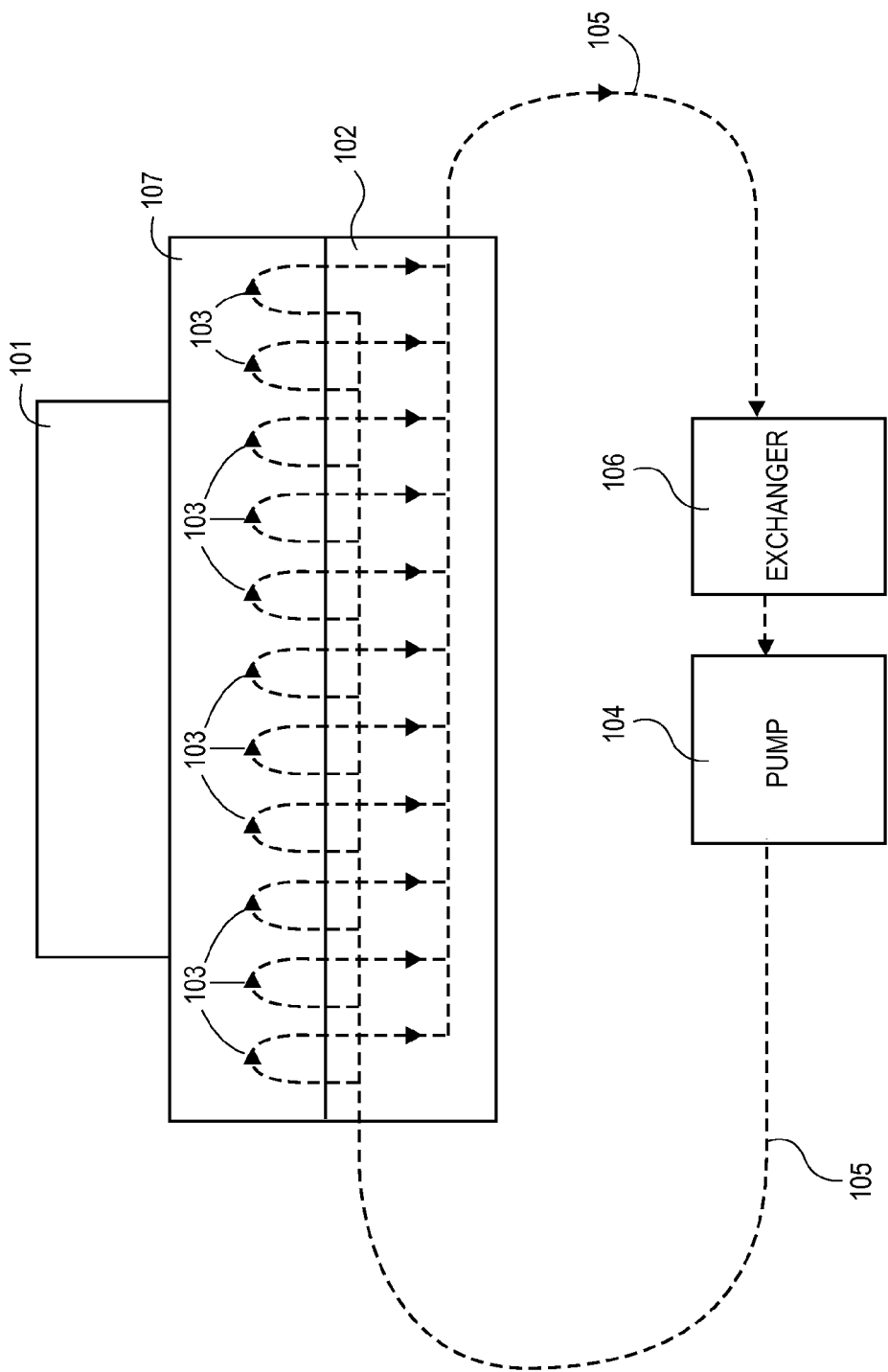
FIG. 1 shows a cooling system.
Figure 2:
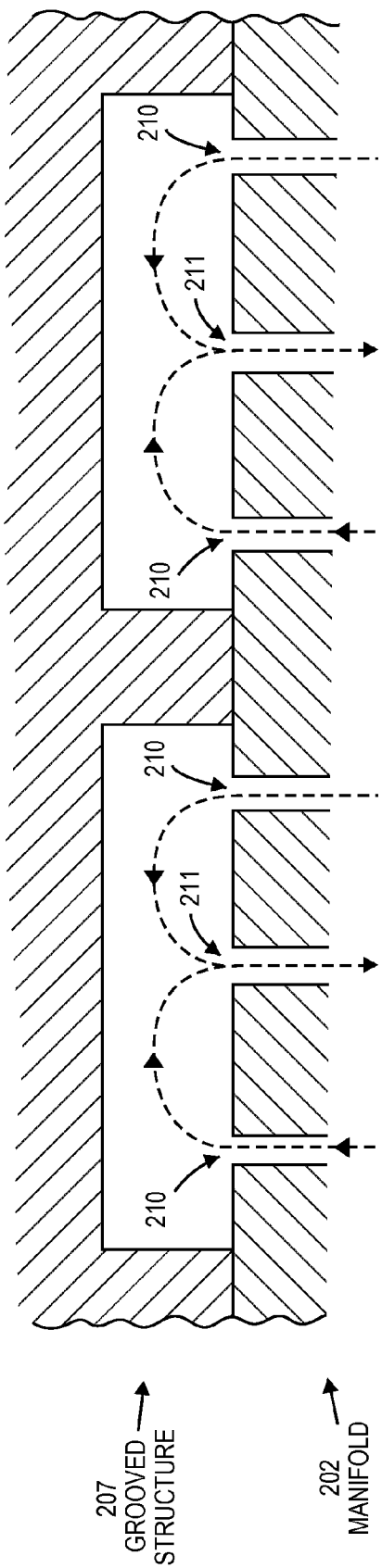
FIG. 2 shows a prior art fluidic channel.
Figure 3:
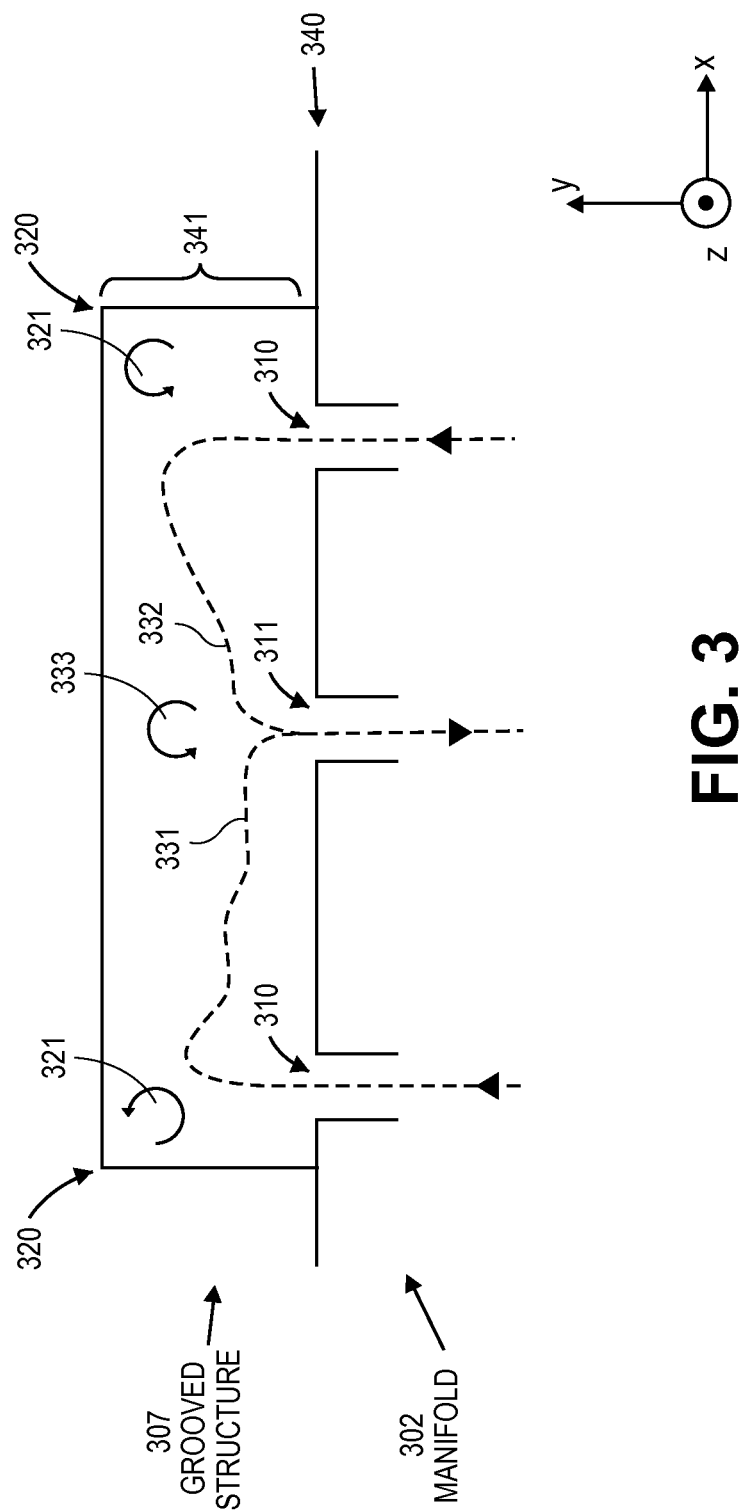
FIG. 3 pertains to inefficiencies associated with the prior art fluidic channel of FIG. 2.

FIG. 3 elaborates on some inefficiencies that have been discovered with respect to the prior art channel structure of FIG. 2.

Firstly, the structure has right-angled corners 320 above the exit openings 310 of the manifold 302 where the fluid first enters the grooved structured 307. The right-angled corners 320 have the effect of "abruptly" causing the fluid to covert from a vertical fluid flow to a horizontal fluid flow. This abrupt conversion creates swirls 321 or other circular/stagnant flows that depart from the principle of keeping the fluid rapidly moving in contact across the surface of the grooved structure 307. As such, portions 321 of the fluid flow do not contribute to the heat removal process and instead increase the overall fluidic resistance of the channel. Both factors diminish system efficiency.

Secondly, different heated fluid flows 331, 332 "collide" above the entrance opening 311 of the manifold 302 before being drawn back into the manifold 302. Again, more swirling/stagnant fluid flows 333 are created where fluid does not rapidly move across the surface of the grooved structure 307. Again, system efficiency is reduced.

Thirdly, the entire plane of the upper surface 340 of the manifold 302 is flat where it interfaces with the grooved structure 307. As a consequence, it is difficult to create a channel having low fluidic resistance that also induces fluid flow over a large surface area of the grooved structure 307. Said another way, if the height 341 of the channel is increased to reduce the fluidic resistance of the channel (by increasing the cross sectional surface area through which the fluid flows), the most rapid portions of the fluid will flow through the middle of the channel as depicted out of contact with the surface of the grooved structure 307.

By contrast if the height 341 of the channel is decreased to force the mainstream fluid flow closer to the surface of the grooved structure 307, the fluidic resistance of the channel is increased (because the cross sectional surface area through which the fluid flows has been decreased). Thus, for a same fluid velocity, the former approach has reduced efficiency because not enough of the rapidly flowing fluid is in contact with the surface of the grooved structure 307, while, the later approach has reduced efficiency because it requires a more powerful pump. Thus, irrespective of its dimensions, the simplistic channel design of FIG. 3 has inherent inefficiencies.

Figure 4A:
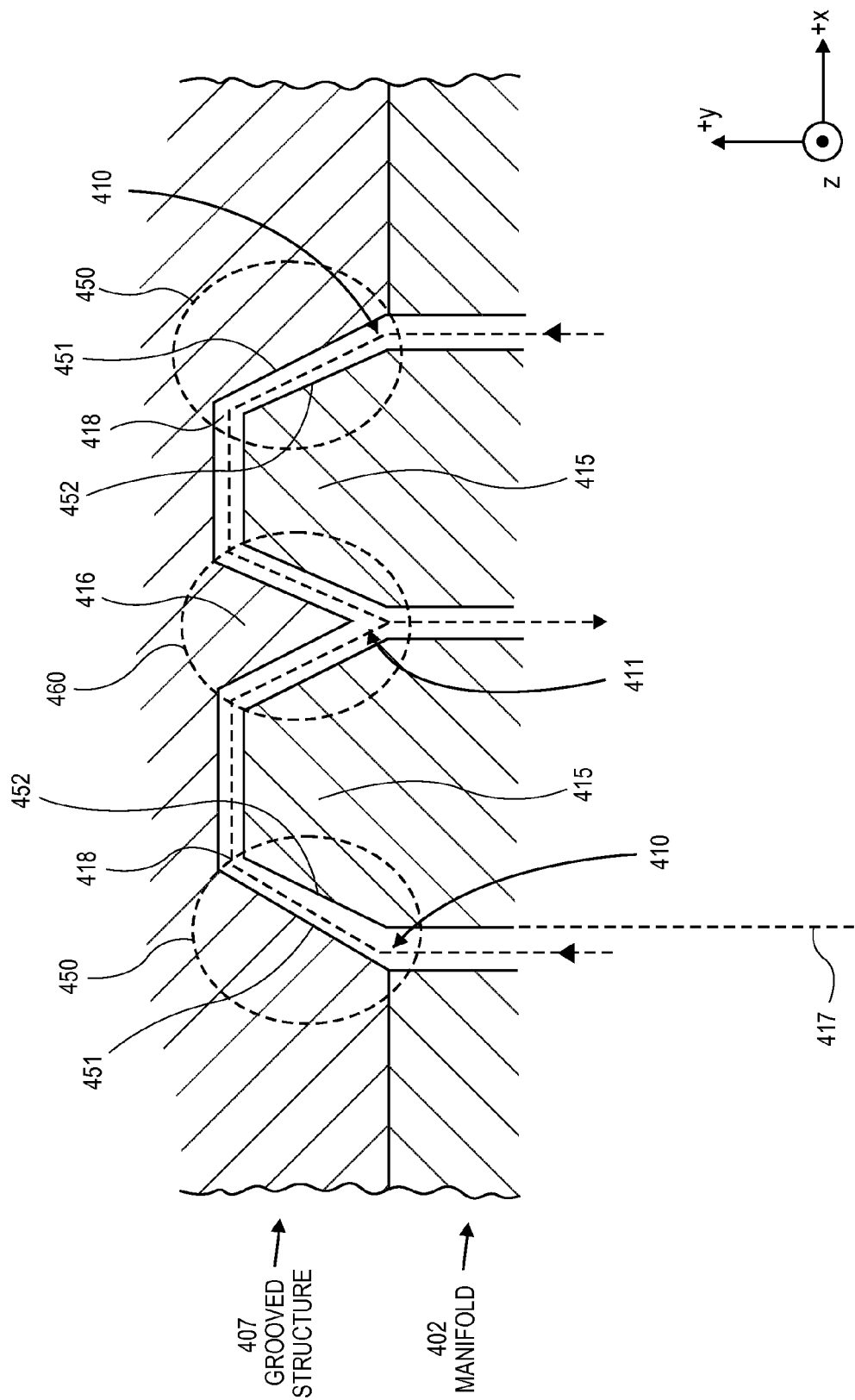
FIG. 4a shows a first perspective of an improved fluidic channel.
Figure 4B:
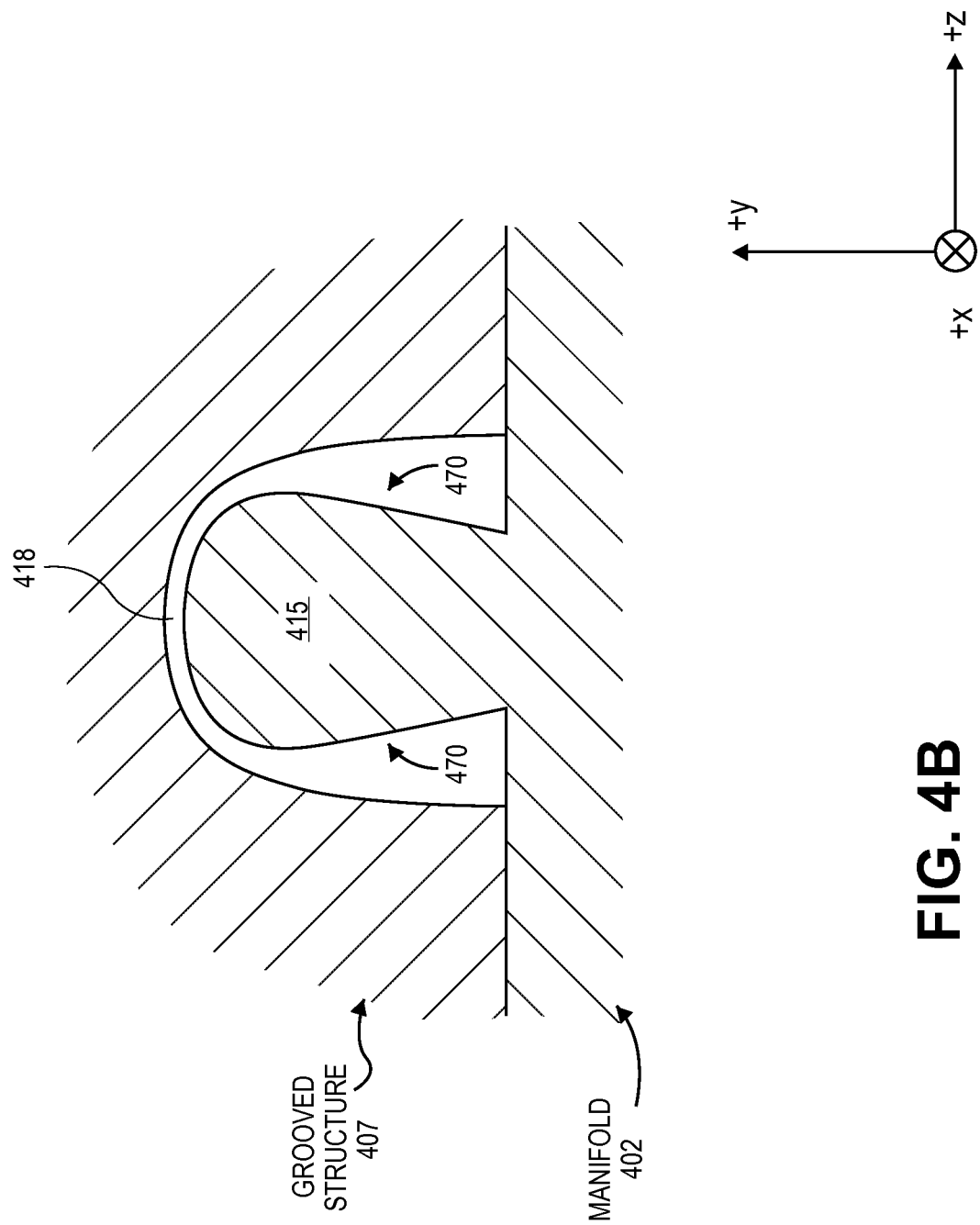
FIG. 4b shows a second perspective of an improved fluidic channel.

FIGS. 4a and 4b depict an embodiment of an improved channel design that includes a number of improvements over the prior art approach of FIG. 2.

As observed in FIG. 4a, the improved channel design: 1) eliminates right-angled corners where the fluid flow converts from a vertical flow coming through the manifold exit openings 410 to a horizontal flow that flows across the surface of the grooved structure 407; 2) includes a protrusion 416 stemming from the grooved structure 407 to eliminate colliding flows proximate to the manifold entry opening 411; 3) includes protrusions 415 stemming from the surface of the manifold 402 to allow for improved fluidic surface area coverage while at the same time keeping the overall fluidic resistance of the channel low.

With respect to the removal of the right-angled corners, note that, smoother channel entrance zones 450 are built in the interface between the grooved structure 407 and the manifold 402 above the manifold exit openings 410. The surfaces 451, 452 of the smooth channel entrance zones 450 are oriented at angles other than parallel to the x and y axis to avoid violent transition of the fluid from a vertical (+y) direction to a horizontal direction (along the x axis). By avoiding violent vertical to horizontal fluid flow transition the fluid has a propensity to not form swirls or other stagnant flows as it is injected from the manifold 402 into the channel.

Instead, the momentum of the upward vertical flow emanating from the manifold exit openings 410 forces the fluid to flow along the surface 451 of the grooved structure 407 that forms part of the entrance zone 450. With the fluid being emitted into the entrance zone 450 with some velocity owing to the action of the pump and flowing closely along the surface 451 of the grooved structure 407 without swirls or other stagnations, the fluid flow meets the characteristics of a more efficient system (rapidly moving fluid across a large surface area of the grooved structure 407 with limited fluidic resistance).

Similarly, through the use of the protrusion 416 that is formed in the grooved structure 407, a smooth fluid exit zone 460 is built in the interface between the grooved structure 407 and the manifold 402 above the manifold entrance opening 411 to eliminate the collision of flows that are leaving the channel and entering the manifold. Here, each independent flow can be envisioned as having its own dedicated exit channel, where, channels whose flows enter the same manifold entrance opening 411 merge together just above the manifold opening 411.

Similar to the form of the entrance zones 450, each dedicated exit channel for a particular flow has surfaces that are oriented at angles other than parallel to the x and y axis to avoid violent transition from horizontal flow to vertical flow. Likewise, the momentum of the horizontal to vertical transition forces fluid to flow along the surface of the grooved structure 407 rather than the surface of the manifold 402. As such, again, swirls and other inefficient disturbances are avoided. Instead, fluid is forced to run over larger surface areas of the grooved structure 407 thereby enhancing the efficiency of the system.

To summarize then, in comparing the prior art channel structure of FIG. 2 with the improved channel structure of FIG. 4a, note that the prior art approach has a simplistic interface between the grooved structure 207 and the manifold 202. The manifold 202 essentially has a flat surface and the grooved structure 207 only presents a cavity that covers the manifold flow entrance and exit openings 210, 211 of the flows that flow into the cavity.

By contrast, the interface between the grooved structure 407 and the manifold 402 of the improved approach of FIG. 4a is more complex including multiple protrusions 415, 416 and corresponding cavities in which the protrusions "fit". These protrusions 415, 416 and opposing cavities as described above effect a more efficient fluid flow by being deliberately designed to force rapid fluid flow over extended surface area regions of the grooved structure 407. As such, swirls and other stagnant motions that diminish the efficiency of the fluid's flow through the channel are substantially reduced as compared to the prior art approach.

Additional improvements are observed in FIG. 4b. FIG. 4b shows a cross section of the channel structure of FIG. 4a where the viewpoint is from plane 417 of FIG. 4a looking in the +x direction. Apart from the improvements described above with respect to FIG. 4a, note that fluid in the channel is designed to surround the protrusion 415 that emanates from the manifold 402 so that more fluid can be spread along the surface of the grooved structure 407.

In an embodiment, referring briefly back to FIG. 4a, the fluid that is injected into the channel is directed upward through narrowed opening 418 between the top of the protrusion 415 and the bottom of the grooved structure 407. The narrowed opening 418, however, corresponds to a higher resistance fluid channel.

The width of the protrusion 415 as measured along the z axis is therefore tapered 470 such that the width of the protrusion continually narrows moving toward the manifold 402. The decreasing width 470 of the protrusion effectively creates wider openings along the sides of the protrusion 415 nearer to the manifold 402, which in turn, corresponds to reduced fluidic resistance in the cavities along the side of the protrusion 415 as compared to the top of the protrusion 415.

As a consequence of the lower fluidic resistance along the sides of the protrusion 415 and the force at which the fluid flows vertically though the manifold exit opening, the fluid will have an impetus to flow along the outer walls of the side channels (along the surface of the manifold 407) as the fluid flows down the channel (rather than along the top of the protrusion 415). The fluid flow across the outer walls of the side channels corresponds to greater surface area coverage of the grooved structure 407 by the fluid flow thereby increasing the amount of heat removed. As such, a highly efficient overall solution is realized.

Apart from the fluid flow being dispersed over larger surface areas of the grooved structure 407 along lower fluidic resistant channels, it is pertinent to re-emphasize that the system can use lower fluid flow rates which further enhances the system's efficiency. In particular, note that the structures 415, 416, 450, 460, 470 used to form the channel are designed with an emphasis on forcing the fluid to flow along the various surfaces of the grooved structure 407. Here, ideally, no more fluid volume in the channel is needed than that required for efficient heat transfer. And, heat transfer from a surface (such as surface 407) to fluid occurs more efficiently when the so-called "boundary layer" (where flow develops from zero velocity (at the surface wall) to fully developed flow away from the surface) is thinner. Given that (for a given flow rate) a narrower flow channel results in a thinner boundary layer, lack of flow channeling features requires higher overall fluid flow rates to achieve a thin boundary layer. Higher flow adds additional load on the pump which reduces system efficiency and also requires larger, more expensive plumbing (increased diameter hose, tubing, connector, valve, etc).

FIG. 4b also shows a smooth, curved cross section rather than rigid rectangular structures. The use of smoothed curved structures help reduce fluidic resistance (as rectangular structures or sudden changes in orientation can create swirls, etc.).

Thus, to summarize, the use of structures that are designed to promote fluid flow through low resistance channels along extended surface areas of the grooved structure 407 provides for higher velocity, lower volume fluid flows, all of which in combination provides for significant heat removal even with a lower performance pump. Note that lower volume fluid flows can even include fluid volumes that do not substantially fill the fluidic channels. The actual fluid volume can be 25% or less of the original fluidic channel volume.

It is pertinent to point out that the features of FIGS. 4a and 4b are exemplary. Alternate embodiments may exist that are structurally different than the depictions of FIGS. 4a and 4b yet still embrace the teachings of the present discussion.

As just one example, the depicted fluid flows of FIG. 4a may be reversed. That is fluid may enter the channel from manifold opening 411 and leave the channel from manifold openings 410. Other than the fact that the stream that is entering the channel would be "split" by protrusion 416, the same principles described above will still apply.

Also, whereas FIG. 4a depicts a pair of fluidic flows flowing into a same manifold entrance opening 411, in other embodiments only a single fluid flow flows in and out of a pair of manifold entrance and exit openings. For example, protrusion 416 may be extended lower such that its sides form another side wall structure that is similar in design to feature 450.

Additionally, although sudden angular changes are observed in the surfaces of the grooved structure 407 and the manifold 402 of FIG. 4a, instead, such changes may be made more gradual such that the surfaces are continuously smooth (akin to the structures observed in FIG. 4b). The specific angles observed in FIG. 4a may also change from embodiment to embodiment. Moreover, a single surface (e.g., surface 451 or 452 in FIG. 4a may exhibit more angular orientation changes than depicted in FIG. 4a).

As discussed above, the grooved structure 407 should be thermally conductive so that heat can be transferred from the heat generation element to the bottom surface of the grooved structure 407 (or, alternatively, the heat generation element can be replaced with a "cold sink" where heated fluid is pumped into the channel to warm it). The grooved structure should be composed of a material that can be routed, milled, cast, 3D printed, etc as required to produce the channel 407 and protrusion 416 features described. Examples include aluminum, copper, ceramics, etc with appropriately compatible machining processes.

The manifold structure 402 does not have a strict heat transfer requirement and material selection is not critical. In fact, it may be desirable to avoid any heat transfer to fluid outside the grooved channel structure 407 and low thermal conductivity material for the manifold 402 would be appropriate. The materials includes plastics, polymers, ceramics, etc. In any case, the manifold material choice should include consideration for producing protrusion 415 and fluid path channels with processes such as drilling, milling, molding, etching, etc.

Although the grooved structure is thermally conductive, it may or may not be electrically conductive depending on the application (e.g., if the grooved structure is made electrically conductive it can be used as a ground plane). The manifold may or may not be thermally conductive or electrically conductive depending on the application. Also, although the embodiments discussed above embraced a design where the surfaces of the protrusions are angled, conceivably other design approaches may exist where fluidic flow is allowed to enter the manifold perpendicular to the surface of the interface between the grooved structure and the manifold (e.g., but where the shape of the channel as formed by the grooved structure gradually changes such that abrupt changes in fluid flow direction are avoided).

The teachings provided herein are believed to be extended to many different kinds of applications. In one family of applications the heat generation element is a semiconductor die or a packaged semiconductor die. In the case of the former the cooling assembly may reside within the die package. In the case of the later the cooling assembly may reside outside the die package (e.g., as part of the packaged device's underlying PCB platform). In other applications the heat generation element may be any device or unit that generates heat (e.g., a solar panel, an engine, a motor, an exothermic reaction, a light source, etc.).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
   a) a manifold comprising:
      a first surface having a fluidic exit opening and a fluidic entrance opening; a first protrusion emanating from the first surface between the fluidic exit opening and the fluidic entrance opening;
   b) a thermally conductive grooved structure comprising:
      a second surface facing said first surface and comprising a cavity to form a fluidic channel about said first protrusion, said fluid exit opening and fluidic entrance opening facing said cavity so that said fluid is able to exit from said fluidic exit opening and enter said fluidic channel at an interface between said first and second surfaces and so that said fluid is able to exit said fluidic channel and enter said fluidic entrance opening at said interface between the first and second surfaces.

2. The apparatus of claim 1 wherein said grooved structure comprises a second cavity to form a second fluidic channel, said second cavity formed over another fluidic opening in said first surface of said manifold, one of said fluidic exit opening and said fluidic entrance opening to transport fluid of said second fluidic channel.

3. The apparatus of claim 2 wherein said manifold comprises a second protrusion, said second protrusion within said second cavity such that fluid of said second fluid channel flows about said second protrusion.

4. The apparatus of claim 3 wherein said grooved structure comprises a third protrusion between said cavities, said third protrusion comprising side surfaces that form respective parts of said first and second fluidic channels.

5. The apparatus of claim 4 wherein at least one of said first and second protrusions comprise narrowed width toward said first surface when viewed along a direction of fluidic flow.

6. The apparatus of claim 1 wherein said first protrusion comprises narrowed width toward said first surface when viewed along a direction of fluidic flow.

7. The apparatus of claim 1 wherein said fluidic channels are coupled to a pump.

8. The apparatus of claim 7 wherein said pump is in operation and said fluidic channels are not filled with fluid.

9. The apparatus of claim 8 wherein said grooved structure is electrically conducting.

10. The apparatus of claim 8 wherein said grooved structure is not electrically conducting.

11. The apparatus of claim 8 wherein said manifold is electrically conducting.

12. The apparatus of claim 8 wherein said manifold is not electrically conducting.

* * * * *